US006885571B2

(12) United States Patent
Yanagawa

(10) Patent No.: US 6,885,571 B2
(45) Date of Patent: Apr. 26, 2005

(54) ASSOCIATIVE MEMORY HAVING A SEARCH BUS DRIVING CIRCUIT FOR SUPPLYING SEARCH DATA TO ASSOCIATIVE MEMORY CELLS

(75) Inventor: Miki Yanagawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/615,910

(22) Filed: Jul. 10, 2003

(65) Prior Publication Data

US 2004/0008533 A1 Jan. 15, 2004

(30) Foreign Application Priority Data

Jan. 10, 2001 (WO) .............................. PCT/JP01/00069

(51) Int. Cl.$^7$ .............................................. G11C 15/00
(52) U.S. Cl. .................... 365/49; 365/189.07; 365/203; 365/230.03
(58) Field of Search ............................ 365/49, 189.07, 365/203, 230.03

(56) References Cited

U.S. PATENT DOCUMENTS 4,670,858 A * 6/1987 Almy .......................... 365/49
4,862,412 A * 8/1989 Fried et al. .................. 365/49
5,978,246 A   11/1999 Shindo ........................ 365/49
6,240,000 B1 * 5/2001 Sywyk et al. ................ 365/49
6,243,280 B1 * 6/2001 Wong et al. .................. 365/49

FOREIGN PATENT DOCUMENTS

JP       SHO 62-293596 A    12/1987 ....................... 15/4

* cited by examiner

Primary Examiner—Hoai Ho
(74) Attorney, Agent, or Firm—Arent Fox, PLLC

(57) ABSTRACT

A memory cell matrix with a plurality of associative memory cells and match lines are respectively divided into two in the direction of the match line. A first memory cell matrix is provided with a match line pre-charge circuit that pre-charges the match line in the first memory cell matrix, and a match line sense amplifier that detects the potential of the match line. A second memory cell matrix is provided with a match line pre-charge circuit that pre-charges the match line in the second memory cell matrix, a match line sense amplifier that detects the potential of the match line in the second memory cell matrix, and a second match line control circuit. The second match line control circuit operates the match line pre-charge circuit in the second memory cell matrix, to pre-charge the match line, only when the data comparison result in the first memory cell matrix indicates agreement.

4 Claims, 8 Drawing Sheets

US 6,885,571 B2

ASSOCIATIVE MEMORY HAVING A SEARCH BUS DRIVING CIRCUIT FOR SUPPLYING SEARCH DATA TO ASSOCIATIVE MEMORY CELLS

BACKGROUND OF THE INVENTION

1) Field of the Invention

The present invention relates to a large scale, low power consumption associative memory.

2) Description of the Related Art

In ordinary memories, read or write of data is performed by specifying an address. On the other hand, the associative memories have a function for searching and outputting data agreeing with or similar to input search data. The associative memories are also referred to as content addressable storages. The associative memories include a plurality of associative memory cells are connected to each of a plurality of match lines (agreement detection line). As a result of such a configuration, it becomes possible in the associative memories to execute data search simultaneously in all match lines.

When data search is to be executed, it is necessary to pre-charge the potential of all the match lines to a relatively high (hereinafter, "H") level. If the result of the search shows that the data (hereinafter, "retention data") retained in each of the connected associative memory cell agrees with the data to be searched (hereinafter, "search data"), the potential of the respective match lines is maintained at the H level. On the other hand, if there is a disagreement between the retention data and the search data for even one associative memory cell, the potential of the corresponding match line is reduced to a relatively low (hereinafter, "L") level.

Suppose that due to a current search potential of many match lines is reduced to the L level. In order to perform the next search, these match lines are necessary to be pre-charged to the H level. However, there is a disadvantage that a lot of power is consumed in order to pre-charge these match lines from L level to H level.

Various proposals have been heretofore made for reducing power consumption in the associative memory. For example, Japanese Patent Application Laid-Open No. S62-293596 discloses an associative memory in which one word is formed of n bits, comprising a decoder that selects a word for writing n-bit data, a first associative memory cell array in which one word is formed of m bits, a first sense amplifier that detects the comparison result in the first associative memory cell array, a second associative memory cell array in which one word for performing comparison operation by using the output of the first sense amplifier is designated as (n-m) bits, and a second sense amplifier that detects the comparison result of the second associative memory cell array, corresponding to the output of the first sense amplifier.

According to this conventional art, power consumption is reduced since the second associative memory cell array and the second sense amplifier are operated only for the word that has agreed in the first associative memory cell array. However, when the memory capacity of the associative memory increases like nowadays, and the number of match lines becomes several tens times as many as that of at the time of filing this application, for example, 8 k (k=1024), power consumption required for pre-charge of the match lines is considerably larger than the power consumption by the sense amplifier, and hence the power consumption cannot be sufficiently reduced. It is an object of the present invention to provide an associative memory that operates in a large scale and at low power consumption.

SUMMARY OF THE INVENTION

It is an object of the present invention to solve at least the problems in the conventional technology.

The associative memory includes a plurality of match lines, from a first match line to an n-th match line, where n is an integer greater than 1, wherein a plurality of associative memory cells being connected to each match line; a first match line pre-charge circuit that pre-charges the first match line; a first sense amplifier that detects a potential of the first match line; an m-th match line pre-charge circuit that pre-charges an m-th match line, where m is a number of integers from 1 to n; a control circuit for the m-th match line that operates the m-th match line pre-charge circuit, only when the potential of the (m−1)-th match line detected by the (m−1)-th sense amplifier is a potential when stored data in the associative memory cell connected to the (m−1)-th match line agrees with search data; and an m-th sense amplifier that detects a potential of the m-th match line.

According to the associative memory, in the memory cell matrix in the latter stage, only a match line corresponding to a match line in which the stored data agrees with the search data in the memory cell matrix in the preceding stage is pre-charged. In other words, a match line in the memory cell matrix in the latter stage, corresponding to a match line in which the data disagrees with each other in the memory cell matrix in the preceding stage, is not pre-charged. Therefore, even if there are many match lines in which the data disagrees with each other in the memory cell matrix in the preceding stage, the power consumption resulting from these match lines is zero.

The other objects, features and advantages of the present invention are specifically set forth in or will become apparent from the following detailed descriptions of the invention when read in conjunction with the accompanying drawings.

DETAILED DESCRIPTION

Exemplary embodiments of the associative memory according to the present invention will be explained in detail, with reference to the drawings.

1. Configuration of Associative Memory Cell

Figure 1:
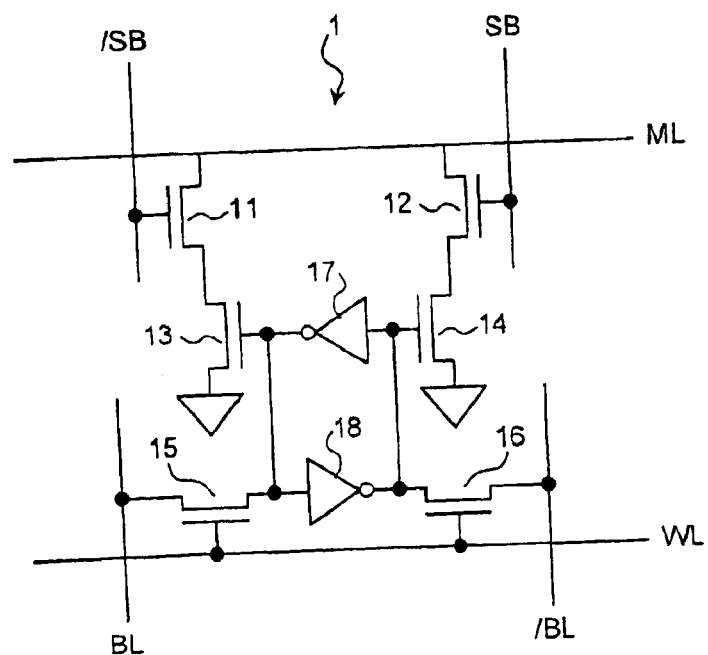
FIG. 1 is a circuit diagram of an associative memory cell constituting an associative memory according to the present invention.

As shown in FIG. 1, an associative memory cell 1 constituting the associative memory comprises two P-channel Metal-Oxide Semiconductor (PMOS) transistors 11, 12; four N-channel Metal-Oxide Semiconductor (NMOS) transistors 13, 14, 15, 16; and two inverters 17, 18. Reference symbol ML denotes a match line, WL denotes a word line, SB and /SB denote a search bus, and BL and /BL denote a bit line. Although not particularly limited, it is assumed, for example, that when search data is "1", the potential of a first search bus SB becomes H level, and on the other hand, the potential of a second search bus /SB becomes L level. The case will be opposite to this when the search data is "0".

The source, gate, and drain of the first PMOS transistor 11 are respectively connected to the match line ML, the search bus /SB, and the drain of the first NMOS transistor 13. The source of the first NMOS transistor 13 is grounded. The source, gate, and drain of the second PMOS transistor 12 are respectively connected to the match line ML, the search bus SB, and the drain of the second NMOS transistor 14. The source of the second NMOS transistor 14 is grounded. The gate of the second NMOS transistor 14 is connected to an input terminal of the first inverter 17, and an output terminal of the first inverter 17 is connected to the gate of the first NMOS transistor 13. The gate of the first NMOS transistor 13 is connected to an input terminal of a second inverter 18, and an output terminal of the second inverter 18 is connected to the gate of the second NMOS transistor 14. The gate of the third NMOS transistor 15 is connected to the word line WL, and the source or drain thereof is connected to the first bit line BL or the gate of the first NMOS transistor 13. The gate of the fourth NMOS transistor 16 is connected to the word line WL, and the source or drain thereof is connected to the second bit line /BL or the gate of the second NMOS transistor 14. Therefore, when the associative memory cell 1 stores data as "1", the gate potential of the first NMOS transistor 13 becomes "L" level, and the gate potential of the second NMOS transistor 14 becomes "H" level, and these are the other way around, when the stored data is "0".

The comparison operation between the stored data in the associative memory cell 1 and the search data will be explained below. At first, at the time of starting the data search, the match line ML is pre-charged to the "H" level. When the search data is "1", the potential of the first search bus SB becomes "H" level, and the potential of the second search bus /SB becomes "L" level. Therefore, the first PMOS transistor 11 becomes ON state, but the second PMOS transistor 12 remains in the OFF state. At this time, when the stored data is "1", that is, when the search data and the stored data agree with each other, since the gate potential of the first NMOS transistor 13 is at "L" level, the first NMOS transistor 13 remains in the OFF state. Therefore, since electric current does not flow from the match line ML to the ground point, the potential of the match line remains at the "H" level. On the other hand, when the stored data is "0", if "1" data is searched, since the first PMOS transistor 11 is in the ON state, and the gate potential of the first NMOS transistor 13 is at the "H" level, the first NMOS transistor 13 becomes ON state. Therefore, electric current flows from the match line ML to the ground point via the first PMOS transistor 11 and the first NMOS transistor 13, and hence the potential of the match line is reduced to about 0 volt. In other words, the potential of the match line remains at the "H" level when the search data agrees with the stored data, and is changed to the "L" level when the search data does not agree with the stored data.

Figure 2:
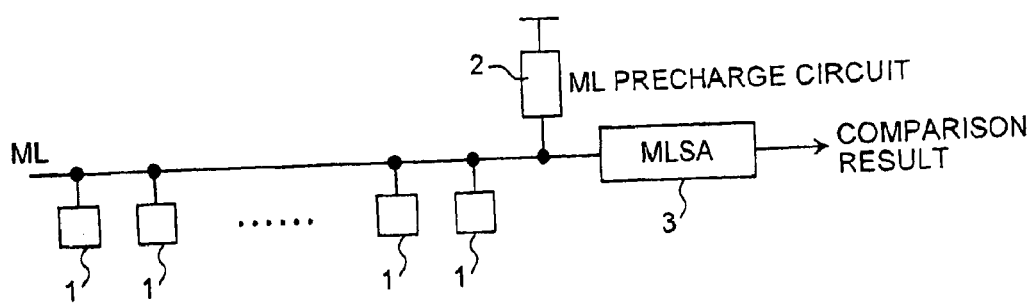
FIG. 2 is a circuit diagram of a portion including associative memory cells constituting the associative memory according to the present invention, a match line pre-charge circuit and a match line sense amplifier.

A plurality of associative memory cells 1 is connected to the same match line ML, as shown in FIG. 2, and in the associative memory cells 1, data comparison is carried out at the same time. The match line ML is pre-charged to a predetermined potential by a match line (ML) pre-charge circuit 2. The potential of the match line ML, that is, the search result of the data is detected by a Match Line Sense Amplifier (MLSA) 3. Hereunder, for the convenience of explanation, the configuration in which the associative memory cells 1, the match line pre-charge circuit 2, and the match line sense amplifier 3 are connected to the one match line ML is referred to as a match line block.

Figure 3:
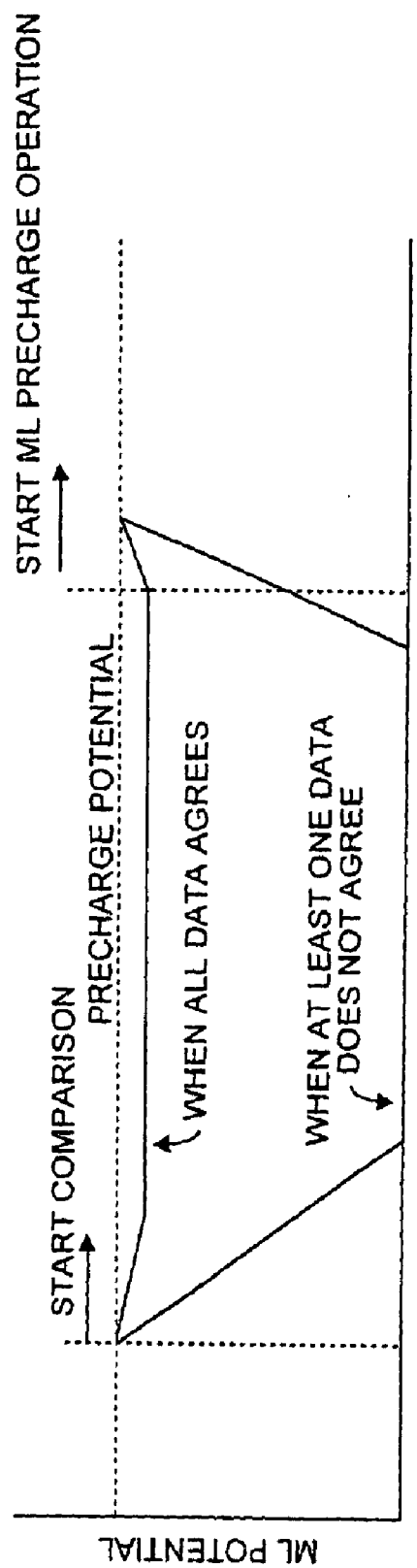
FIG. 3 is a characteristic diagram that depicts the relation between the search result of data and match line potential in the configuration shown in FIG. 2.

When the respective stored data in all associative memory cells 1 connected to the same match line ML agrees with the search data corresponding to the respective bits, as shown in FIG. 3, the potential of the match line ML is substantially at the "H" level. In this case, even if the match line ML is again pre-charged for data search, the power consumption is small. On the other hand, if there is a memory cell in which the stored data and the search data disagree, in all associative memory cells 1 connected to the same match line ML, as shown in FIG. 3, the potential of the match line ML becomes 0 volt. In this case, since the potential of the match line ML must be pre-charged from 0 volt to the "H" level, the power consumption becomes large. As the number of the associative memory cells 1 connected to the same match line ML increases, the power consumed at the time of precharging the match line ML from 0 volt increases. Therefore, in order to reduce the power consumption due to pre-charge of the match line ML, the number of associative memory cells 1 connected to the same match line ML needs only to be reduced.

2. Overall Configuration of Associative Memory

Figure 4:
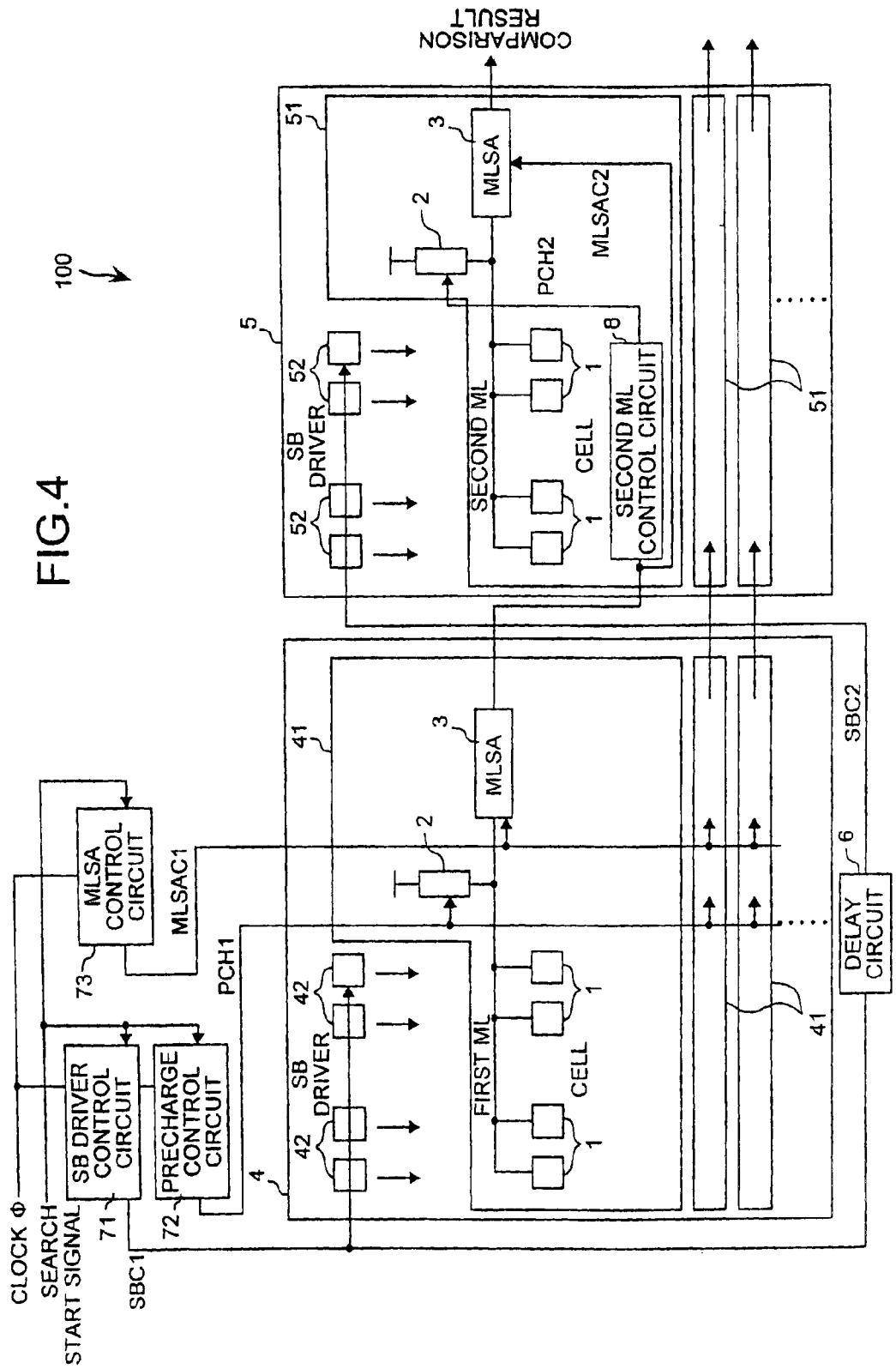
FIG. 4 is a block diagram of the associative memory according to the present invention.

An associative memory 100 shown in FIG. 4 comprises a first memory cell matrix 4, a second memory cell matrix 5, a delay circuit 6, a search bus (SB) driver control circuit 71, a pre-charge control circuit 72, and a match line sense amplifier (MLSA) control circuit 73.

The first memory cell matrix 4 comprises a plurality of match line blocks 41 comprising the match line ML, a plurality of associative memory cells 1, the match line pre-charge circuit 2, and the match line sense amplifier 3. In FIG. 4, only one block in the configuration of the match line block 41 is shown, but the configuration of other match line blocks 41 is the same. The first memory cell matrix 4 comprises search bus driving circuits 42 in the number corresponding to the associative memory cells 1 in the match line block 41.

In the first memory cell matrix 4, a search bus control signal SBC1 is supplied from a search bus driver control circuit 71 to the respective search bus driving circuits 42. Based on the search bus control signal SBC1, the respective search bus driving circuit 42 in the first memory cell matrix 4 supplies search data to the corresponding associative memory cell 1. In the first memory cell matrix 4, a pre-charge signal PCH1 is supplied from the pre-charge control circuit 72 to the respective match line pre-charge circuits 2 in the respective match line blocks 41. When having received the pre-charge signal PCH1, the match line pre-charge circuit 2 pre-charges the corresponding match line ML. In the first memory cell matrix 4, a match line sense amplifier control signal MLSAC1 is supplied from the match line sense amplifier control circuit 73 to the match line sense amplifiers 3 in the respective match line blocks 41. When having received the match line sense amplifier control signal MLSAC1, the match line sense amplifier 3 detects the potential of the corresponding match line ML.

The search bus driver control circuit 71, the pre-charge control circuit 72, and the match line sense amplifier control circuit 73 output a control signal, respectively, based on a clock signal φ and a signal, being a trigger for starting search. The signal, being a trigger for starting search is supplied, when a data search command is decoded in a command decode circuit (not shown), provided outside of the associative memory 100.

The second memory cell matrix 5 comprises a plurality of match line blocks 51 comprising the match line ML, a plurality of associative memory cells 1, the match line pre-charge circuit 2, and the match line sense amplifier 3. In FIG. 4, only one block in the configuration of the match line block 51 is shown, but the configuration of other match line blocks 51 is the same. The second memory cell matrix 5 comprises search bus driving circuits 52 in the number corresponding to the associative memory cells 1 in the match line block 51. In the second memory cell matrix 5, a second match line control circuit 8 for controlling the drive of the match line pre-charge circuit 2 in the respective blocks is provided in the respective match line blocks 51. The second match line control circuit 8 outputs a pre-charge signal PCH2 for precharging the match line ML corresponding to the second memory cell matrix 5, when all the data comparison results in the respective match line blocks 41 of the first memory cell matrix 4 agree, that is, when the output potential of the match line sense amplifier 3 in the first memory cell matrix 4 is at the "H" level.

In the second memory cell matrix 5, the search bus control signal SBC1 supplied from the search bus driver control circuit 71 to the first memory cell matrix 4 is delayed by predetermined timing, that is, by the timing at which data search in the first memory cell matrix 4 finishes, by the delay circuit 6, and supplied to the respective search bus driving circuits 52 as a search bus control signal SBC2. Based on this search bus control signal SBC2, the respective search bus driving circuits 52 in the second memory cell matrix 5 supply search data to the corresponding associative memory cell 1. In the second memory cell matrix 5, the pre-charge signal PCH2 is supplied from the second match line control circuit 8 to the match line pre-charge circuit 2 in the respective match line blocks 51. When having received this pre-charge signal PCH2, the match line pre-charge circuit 2 pre-charges the corresponding match line ML. In the second memory cell matrix 5, an output signal of the match line sense amplifier 3 in the respective match line blocks 41 in the first memory cell matrix 4 is supplied to the match line sense amplifier 3 in the respective match line blocks 51, as a match line sense amplifier control signal MLSAC2. When having received this match line sense amplifier control signal MLSAC2, the respective match line sense amplifiers 3 in the second memory cell matrix 5 output the potential of the corresponding match line ML.

Here, the data searched in the match line block 41 in the first memory cell matrix 4 and the data searched in the match line block 51 in the second memory cell matrix 5 are conventionally the data compared at the same time by the associative memory cells connected to the same match line. In other words, in this embodiment, data as one block comprising a plurality of bits is divided into two blocks of the upper several bits and the remaining lower several bits, and for example, the upper bit data is searched in the first memory cell matrix 4, and the remaining lower bit data is data-searched in the second memory cell matrix 5. At this time, in the second memory cell matrix 5, only the match line ML in which all the stored data agrees with the search data in the first memory cell matrix 4 is pre-charged.

3. Configuration of Match Line Sense Amplifier

Figure 5:
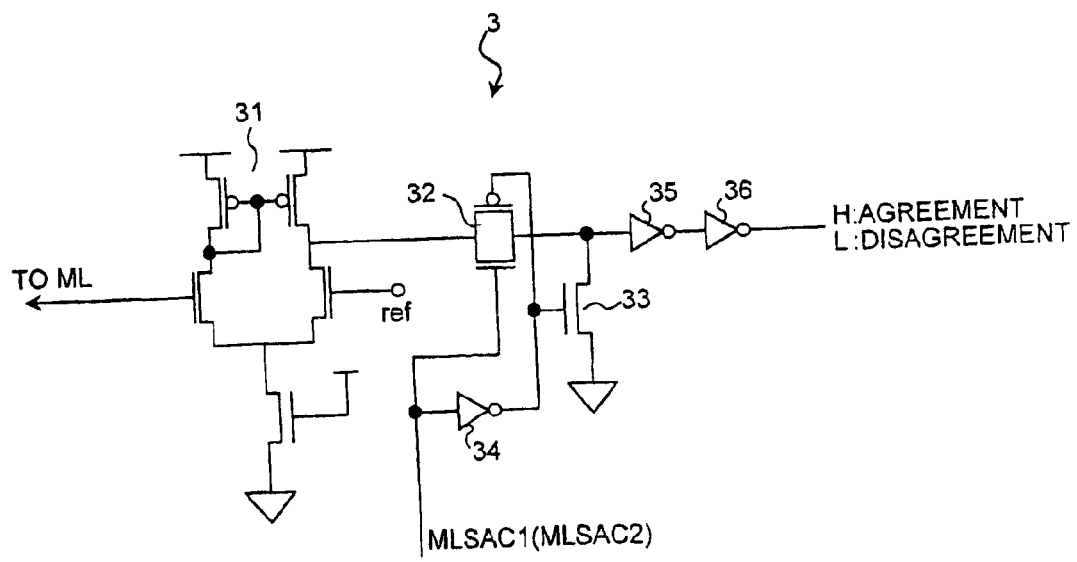
FIG. 5 is a circuit diagram of a match line sense amplifier constituting the associative memory according to the present invention.

The match line sense amplifier 3 has a common configuration in the first memory cell matrix 4 and the second memory cell matrix 5, and for example as shown in FIG. 5, comprises a current mirror circuit 31, a transfer gate 32, an NMOS transistor 33, and three inverters 34, 35, and 36. The output potential of the current mirror circuit 31 becomes "H" level, when the potential of the match line ML is higher than a reference potential Vref, that is, when the data comparison results in all associative memory cells 1 connected to the match line ML indicate agreement. If any one of data comparison results of the associative memory cells 1 connected to the match line ML indicates disagreement, the potential of the match line ML becomes lower than the reference potential Vref, and the output potential of the current mirror circuit 31 becomes "L" level. The transfer gate 32 outputs the output potential of the current mirror circuit 31, when the match line sense amplifier control signal MLSAC1 in the first memory cell matrix 4 (and the match line sense amplifier control signal MLSAC2 in the second memory cell matrix 5) is at the "H" level. The signal output from the transfer gate 32 is output via the two inverters 35 and 36. Therefore, when the data comparison result indicates agreement, the output potential of the match line sense amplifier 3 becomes "H" level, and when the data comparison result indicates disagreement, the output potential of the match line sense amplifier 3 becomes "L" level.

To the output terminal of the transfer gate 32 is connected the NMOS transistor 33, which designates as a gate input a signal obtained by inverting the match line sense amplifier control signal MLSAC1 in the first memory cell matrix 4 (and the match line sense amplifier control signal MLSAC2 in the memory cell matrix 5) by the inverter 34. This NMOS transistor 33 becomes ON state, when the match line sense amplifier control signal MLSAC1 (or the match line sense amplifier control signal MLSAC2) is at the "L" level, to change the output potential of the match line sense amplifier 3 to the "L" level. In the first memory cell matrix 4, at the time of data search, since the "H" level match line sense amplifier control signal MLSAC1 is supplied to all the match line sense amplifiers 3, the output potential of the match line sense amplifier 3 becomes the potential level corresponding to the data search result.

On the other hand, in the second memory cell matrix 5, at the time of data search, a signal of a potential level corresponding to the data search result in the first memory cell matrix 4 is supplied to the match line sense amplifier 3, as the match line sense amplifier control signal MLSAC2. Therefore, when the data search result indicates agreement in the first memory cell matrix 4, the output potential of the match line sense amplifier 3 in the second memory cell matrix 5 corresponding thereto becomes a potential level corresponding to the data search result in the second memory cell matrix 5. When the data search result in the first memory cell matrix 4 indicates disagreement, the NMOS transistor 33 becomes ON state in the match line sense amplifier 3 in the second memory cell matrix 5 corresponding thereto, and hence the output potential of the match line sense amplifier 3 becomes "L" level.

4. Configuration of Second Match Line Control Circuit 8

Figure 6:
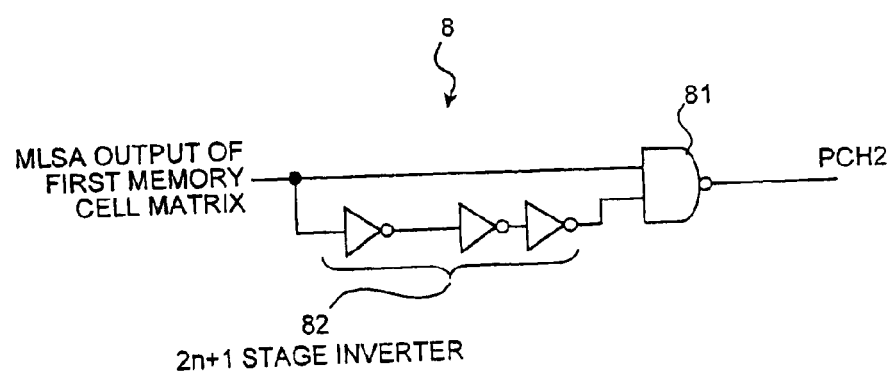
FIG. 6 is a circuit diagram of a second match line control circuit constituting the associative memory according to the present invention.

The second match line control circuit 8 comprises, for example as shown in FIG. 6, an NAND circuit 81 and an inverter delay circuit 82. The inverter delay circuit 82 has a configuration such that 2n+1 stage inverters are connected serially. A signal output from the match line sense amplifier 3 in the first memory cell matrix 4 is input to one of the input terminals of the NAND circuit 81 and the input terminal of the inverter delay circuit 82. The output signal from the inverter delay circuit 82 is supplied to the other input terminal of the NAND circuit 81. In other words, the NAND circuit 81 outputs an "L" level pulse signal as a pre-charge signal PCH2 for precharging the match line ML in the second memory cell matrix 5, immediately after the output signal of the match line sense amplifier 3 in the first memory cell matrix 4 is changed from the "L" level to the "H" level.

5. Configuration of Match Line Pre-Charge Circuit 2

Figure 7:
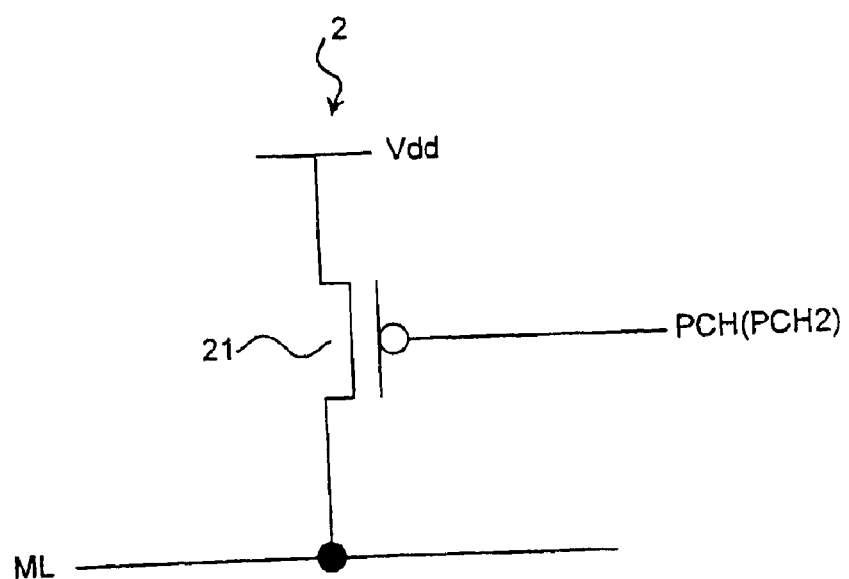
FIG. 7 is a circuit diagram of a match line pre-charge circuit constituting the associative memory according to the present invention.

The match line pre-charge circuit 2 has a common configuration in the first memory cell matrix 4 and the second memory cell matrix 5, and for example as shown in FIG. 7, comprises a PMOS transistor 21. This PMOS transistor 21 becomes ON state by the "L" level pulse signal of the pre-charge signal PCH1 (or PCH2), and applies source potential Vdd to the match line ML.

6. Explanation of Data Search Operation of Associative Memory 100

Variations of the respective signals at the time of data search of the associative memory 100 are explained.

(1) When search Result Indicates Agreement

Figure 8:
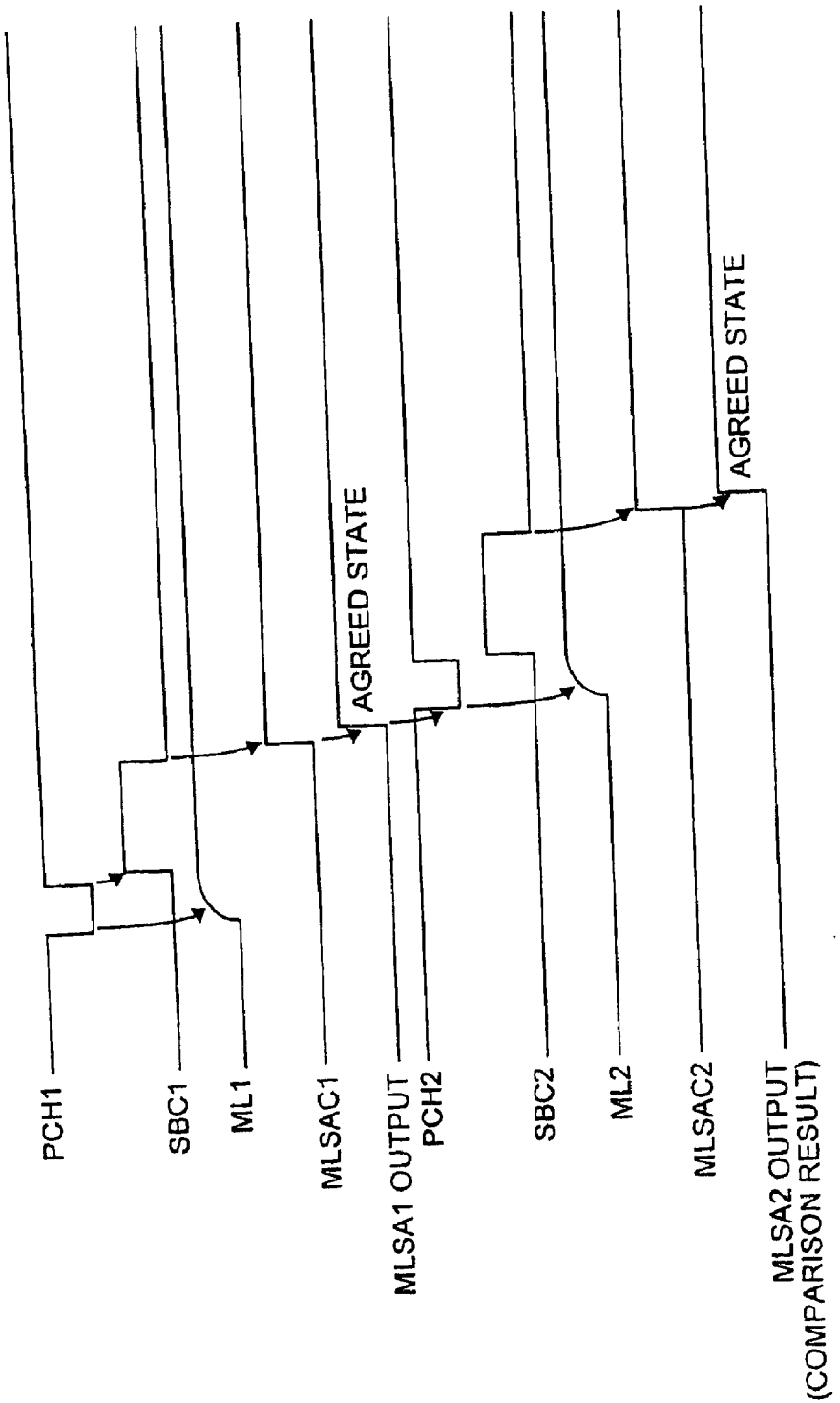
FIG. 8 is a waveform diagram that depicts changes in the respective signal waveforms, when the data agrees with each other in the associative memory according to the present invention.

An example in which, as a result of data search in a certain match line block 41 in the first memory cell matrix 4, the stored data in the block 41 agrees with the search data will be explained, with reference to FIG. 8. When a signal that becomes a trigger for starting search is provided to the associative memory 100 from the command decode circuit (not shown), data search is started. At first, the pre-charge signal PCH1 to the first memory cell matrix 4 changes from the "H" level to the "L" level. Based on the trailing edge at that time, the match line ML in the first memory cell matrix 4 is pre-charged from the "L" level to the "H" level. The pre-charge signal PCH1 to the first memory cell matrix 4 is controlled by the pre-charge control circuit 72 so that it changes to the "H" level at a point in time when pre-charge of the match line ML is finished. After the pre-charge signal PCH1 returns to the "H" level, the search bus control signal SBC1 to the first memory cell matrix 4 changes from the "L" level to the "H" level, so that the search data is supplied to the respective associative memory cells 1 in the first memory cell matrix 4. When comparison between the stored data and the search data is finished in the respective associative memory cells 1 in the first memory cell matrix 4, the search bus control signal SBC1 returns to the "L" level. The match line sense amplifier control signal MLSAC1 then changes from the "L" level to the "H" level. As a result, the match line sense amplifier 3 in the first memory cell matrix 4 becomes a state in which it can output an "H" level signal or an "L" level signal based on the potential of the match line ML. Here, since the search result indicates agreement, the output signal MLSA1 of the match line sense amplifier 3 changes from the "L" level to the "H" level.

Upon change of the output signal MLSA1 of the match line sense amplifier 3 in the first memory cell matrix 4, the pre-charge signal PCH2 to the second memory cell matrix 5 changes from the "H" level to the "L" level. Based on the trailing edge at that time, the match line ML in the second memory cell matrix 5 is pre-charged from the "L" level to the "H" level. The pre-charge signal PCH2 to the second memory cell matrix 5 changes to the "H" level at a point in time when pre-charge of the match line ML is finished, like the pre-charge signal PCH1 to the first memory cell matrix 4. Thereafter, the search bus control signal SBC2 to the second memory cell matrix 5 changes from the "L" level to the "H" level, so that the search data is supplied to the respective associative memory cells 1 in the second memory cell matrix 5, and data comparison is carried out. After the data comparison is finished, the match line sense amplifier control signal MLSAC2 changes from the "L" level to the "H" level. As a result, the match line sense amplifier 3 in the second memory cell matrix 5 becomes a state in which it can output an "H" level signal or an "L" level signal based on the potential of the match line ML. Here, since the search result indicates agreement, the output signal MLSA2 of the match line sense amplifier 3, that is, the comparison result in the associative memory 100 is changed from the "L" level to the "H" level.

(2) When Search Result Indicates Disagreement

Figure 9:
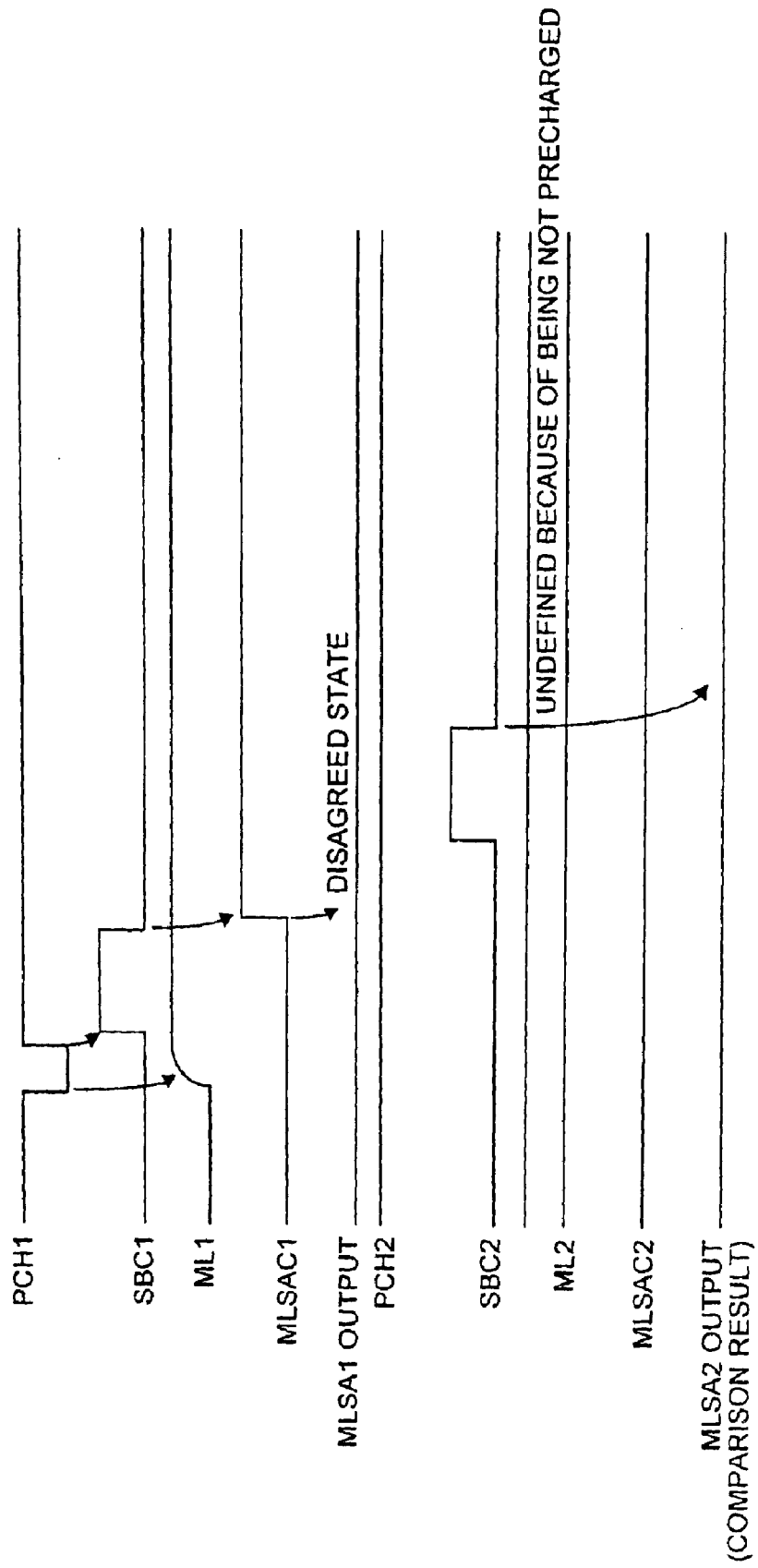
FIG. 9 is a waveform diagram that depicts changes in the respective signal waveforms, when the data disagrees in the associative memory according to the present invention.

An example in which, as a result of data search in a certain match line block 41 in the first memory cell matrix 4, the stored data in the match line block 41 does not agree with the search data will be explained, with reference to FIG. 9. The steps from starting data search until the comparison between the stored data in the respective associative memory cells 1 in the first memory cell matrix 4 and the search data is finished and the match line sense amplifier 3 in the first memory cell matrix 4 becomes a state capable of outputting are the same as those in the example (1) when the search result indicates agreement. Since the search result indicates disagreement here, the output signal MLSA1 of the match line sense amplifier 3 in the first memory cell matrix 4 remains at the "L" level. Therefore, the pre-charge signal PCH2 to the second memory cell matrix 5 remains at the "H" level, and hence the match line ML in the second memory cell matrix 5 is not pre-charged. As a result, even if the search bus control signal SBC2 to the second memory cell matrix 5 becomes "H" level, and the search data is supplied to the respective associative memory cells 1 in the second memory cell matrix 5, the data comparison result is undefined. At this time, since the match line sense amplifier control signal MLSAC2 of the second memory cell matrix 5 remains at the "L" level, the match line sense amplifier 3 in the second memory cell matrix continues to output the "L" level signal, regardless of the potential of the match line ML. In other words, the output signal MLSA2 of the match line sense amplifier 3, that is, the comparison result in the associative memory 100 becomes "L" level.

The read operation of data from the associative memory 100 and the write operation of data to the associative memory 100 are as usual, and hence the explanation thereof is omitted.

In this manner, in the match line block 41 in the first memory cell matrix 4, when the data search result indicates disagreement, the match line ML in the second memory cell matrix 5 corresponding to the block is not pre-charged. Hence, the power consumption at the time of data search can be reduced. For example, in a conventional associative memory, it is assumed that a plurality of associative memory cells connected to the same match line is divided into two, that is, to the first memory cell matrix 4 and the second memory cell matrix 5. In this case, the number of the associative memory cells 1 connected to the same match line ML in the first memory cell matrix 4 is half the number in the conventional associative memory, and hence the power consumption at the time of precharging all the match lines ML in the first memory cell matrix 4 becomes substantially half of the conventional case. In the second memory cell matrix 5, since only a part of all of the match line ML is pre-charged, the power consumption at that time is little. As a result, as the whole associative memory 100, the power consumed due to pre-charge at the time of data search becomes slightly larger than the half of the conventional case.

7. Other Configuration of Associative Memory

Figure 10:
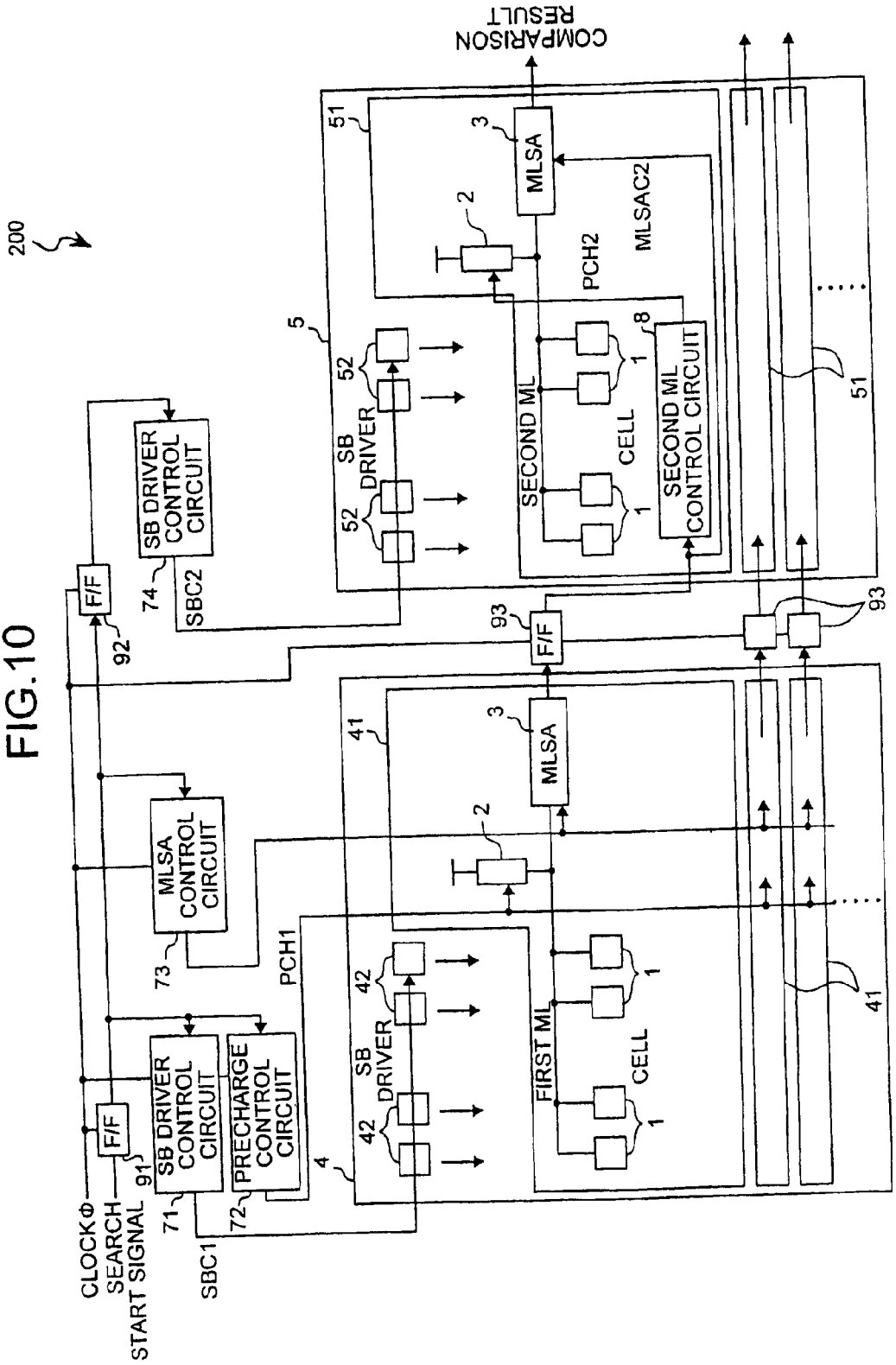
FIG. 10 is a block diagram of the associative memory according to a different embodiment of the present invention.

An associative memory 200 shown in FIG. 10 has a configuration such that a second search bus driver control circuit 74 and first to third latch circuits (flip-flops) 91, 92 and 93 are added to the associative memory 100 shown in FIG. 4, and the delay circuit 6 is deleted, so that the data comparison operation in the first memory cell matrix 4 and the data comparison operation in the second memory cell matrix 5 are performed in the pipeline operation.

The first latch circuit 91 latches a signal, being a trigger for starting search, supplied from the command decode circuit (not shown) to the associative memory 200, and outputs the signal to the search bus driver control circuit 71, the pre-charge control circuit 72, and the match line sense amplifier control circuit 73, synchronously to the next clock pulse. The output signal of the first latch circuit 91 is latched at the second latch circuit 92, and supplied to the second search bus driver control circuit 74, synchronously to the next clock pulse. The second search bus driver control circuit 74 supplies a search bus control signal SBC2 to the search bus driving circuit 52 in the second memory cell matrix 5. The third latch circuit 93 latches an output signal MLSA of the match line sense amplifier 3 in the first memory cell matrix 4, and outputs the signal to the second match line control circuit 8 in the second memory cell matrix 5, synchronously to the next clock pulse. By having such a configuration, the pipeline operation becomes possible, thereby enabling high speed operation.

The data search operation in the associative memory 200 is as explained above with reference to FIG. 8 and FIG. 9, and hence the explanation thereof is omitted. The explanation of the read operation of data from the associative memory 200 and the write operation of data to the associative memory 200 is also omitted.

Specific examples of the present invention are shown and explained above, but it is obvious to those skilled in the art that modifications of these specific examples and other embodiments are possible. For example, the associative memory cell 1, the match line pre-charge circuit 2, the match line sense amplifier 3, and the second match line control circuit 8 can be variously modified. Further, the third memory cell matrix and after may be serially connected to the post stage of the second memory cell matrix 5, so that the memory cell matrix becomes the associative memory having an n-stage configuration. Needless to say, such modifications of the embodiment and other embodiments are included in the scope of the present invention limited by the scope of claims.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An associative memory comprising:
   a plurality of match lines, from a first match line to an n-th match line, where n is an integer greater than 1, wherein a plurality of associative memory cells being connected to each match line;
   a first match line pre-charge circuit that pre-charges the first match line;
   a first sense amplifier that detects a potential of the first match line;
   an m-th match line pre-charge circuit that pre-charges an m-th match line, where m is a number of integers from 2 to n;
   a control circuit for the m-th match line that operates the m-th match line pre-charge circuit, only when the potential of the (m−1)-th match line detected by the (m−1)-th sense amplifier is a potential when stored data in the associative memory cell connected to the (m−1)-th match line agrees with search data;
   an m-th sense amplifier that detects a potential of the m-th match line;
   an m-th search bus driving circuit that supplies search data to the associative memory cells connected to the m-th match line, after the m-th match line has been pre-charged;
   an (m−1)-th search bus driving circuit that supplies search data to the associative memory cells connected to the (m−1)-th match line; and
   a delay circuit that supplies a search bus control signal for activating the (m−1)-th search bus driving circuit to the (m−1)-th search bus driving circuit, with predetermined timing delayed in order to activate the m-th search bus driving circuit.

2. The associative memory according to claim 1, wherein both n and m are equal to 2.

3. An associative memory comprising:
   a plurality of match lines, from a first match line to an n-th match line, where n is an integer greater than 1, wherein a plurality of associative memory cells being connected to each match line;
   a first match line pre-charge circuit that pre-charges the first match line;
   a first sense amplifier that detects a potential of the first match line;
   an m-th match line pre-charge circuit that pre-charges an m-th match line, where m is a number of integers from 2 to n;
   a control circuit for the m-th match line that operates the m-th match line pre-charge circuit, only when the potential of the (m−1)-th match line detected by the (m−1)-th sense amplifier is a potential when stored data in the associative memory cell connected to the (m−1)-th match line agrees with search data;
   an m-th sense amplifier that detects a potential of the m-th match line;
   a first latch circuit that temporarily holds the potential of the (m−1)-th match line detected by the (m−1)-th sense amplifier, and supplies the potential to the m-th match line control circuit, synchronously to the next clock pulse;
   an (m−1)-th search bus driving circuit that supplies search data to associate memory cells connected to the (m−1)-th match line;
   an m-th search bus driving circuit that supplies search data to associative memory cells connected to the m-th match line; and
   a second latch circuit that temporarily holds a search bus control signal for activating the (m−1)-th search bus driving circuit, and supplies it to the m-th search bus driving circuit, synchronously to the next clock pulse, as a search bus control signal for activating the m-th search bus driving circuit, wherein data search with respect to the associative memory cells connected to the (m−1)-th match line, and data search with respect to the associative memory cells connected to the m-th match line are carried out with a pipeline operation.

4. The associative memory according to claim 3, wherein both n and m are equal 2.

* * * * *